United States Patent
Lin et al.

(10) Patent No.: US 7,342,255 B2
(45) Date of Patent: Mar. 11, 2008

(54) HIGH-BRIGHTNESS LIGHT-EMITTING DIODE

(75) Inventors: Huei-Tso Lin, Chiayi Hsien (TW); Ching-Yuan Lin, Chiayi Hsien (TW)

(73) Assignee: Para Light Electronics Co., Ltd., Taipei (TW)

( * ) Notice: Subject to any disclaimer, the term of this patent is extended or adjusted under 35 U.S.C. 154(b) by 440 days.

(21) Appl. No.: 11/138,365

(22) Filed: May 27, 2005

(65) Prior Publication Data

US 2006/0267041 A1 Nov. 30, 2006

(51) Int. Cl.
*H01L 29/24* (2006.01)
(52) U.S. Cl. .................. 257/79; 257/100; 257/E25.032
(58) Field of Classification Search .................. 257/79, 257/98, 99, 100, 103, 676, E25.032
See application file for complete search history.

(56) References Cited

U.S. PATENT DOCUMENTS

| | | | |
|---|---|---|---|
| 6,924,596 B2* | 8/2005 | Sato et al. | 313/512 |
| 2006/0186423 A1* | 8/2006 | Blonder et al. | 257/98 |

\* cited by examiner

*Primary Examiner*—Brook Kebede
(74) *Attorney, Agent, or Firm*—Troxell Law Office, PLLC

(57) ABSTRACT

A high-brightness light-emitting diode is disclosed. The high-brightness light-emitting diode, comprises: a chip; a base for holding the chip; and a transparent layer for covering the chip, wherein the chip is connected to an electrode by a metal wire. The improvement comprises an adhesive injection hole formed on the transparent layer for injecting a layer of fluorescent-powdered adhesive into it, thereby providing the light-emitting diode with the advantages such as good light collection and uniform light shape.

6 Claims, 3 Drawing Sheets

HIGH-BRIGHTNESS LIGHT-EMITTING DIODE

FIELD OF THE INVENTION

The present invention relates to a high-brightness light-emitting diode with good light collection and uniform light shape for being suitable to the light-emitting diode or the like.

BACKGROUND OF THE INVENTION

The existence of the light-emitting diode brings the user much more diversified utilization. Referring to FIG. 3, a conventional light-emitting diode is shown. This conventional light-emitting diode, comprises: a chip B; a transparent layer C; and a base A on which a notched trench is formed, wherein the chip B is mounted in the notched trench of the base A, and coupled with the base A by the injection molding of the transparent layer C. The light color of the conventional light-emitting diode is determined by the color of the light, which is emitted from the chip B. The transparent layer B is unable to change the light color of the light-emitting diode.

Furthermore, the target of the manufacturer is to develop the white light-emitting diode, wherein its light color is similar to that of the fluorescent lamp. The manufacture of the white light-emitting diode is sorted into two major methods. One method is to emit the white light by combining red, blue, and green dies. Its key technology consists in the balance of red, blue, and green colors. The production cost is very high since it is composed of three dies. The other method is to combine a UV die with a transparent layer, which is composed of the red, blue, and green fluorescent powders, for emitting the white light. However, the development of UV die is not mature, so it cannot become the main stream.

In view of the description mentioned above, the present inventor makes diligent studies with a quiet mind in designing and manufacturing a high-brightness light-emitting diode having good light collection and uniform light shape for changing the light color of the high-brightness light-emitting diode by the simplified structure and for reducing the production cost.

SUMMARY OF THE INVENTION

It is a main object of the present invention to change the light color of the high-brightness light-emitting diode by the simplified structure.

It is another object of the present invention to provide the high-brightness light-emitting diode with colorful light.

It is a further object of the present invention to provide the high-brightness light-emitting diode with good light collection and uniform light shape.

In order to achieve the aforementioned objects, a high-brightness light-emitting diode is disclosed. The high-brightness light-emitting diode, comprises: a chip; a base for holding the chip; and a transparent layer for covering the chip, wherein the chip is connected to an electrode by a metal wire. The improvement comprises an adhesive injection hole formed on the transparent layer for injecting a layer of fluorescent-powdered adhesive into it, thereby providing the light-emitting diode with the advantages such as good light collection and uniform light shape.

The aforementioned objects and advantages of the present invention will be readily clarified in the description of the preferred embodiments and the enclosed drawings of the present invention.

DETAILED DESCRIPTION OF THE PREFERRED EMBODIMENT

Figure 1:
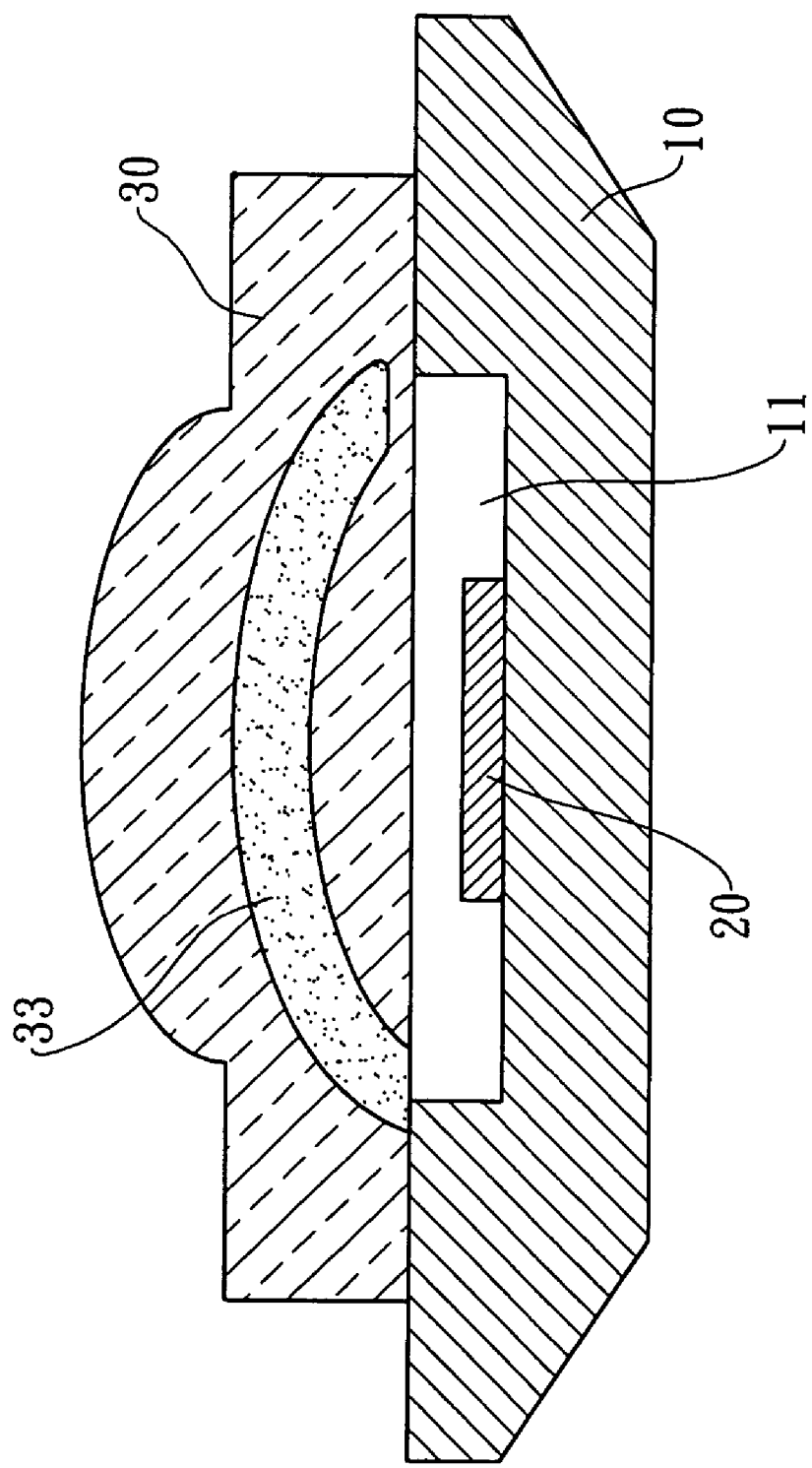
FIG. 1 is a cross-sectional view showing a preferred embodiment of the present invention.

Referring to FIG. 1, the high-brightness light-emitting diode of the present invention comprises: a base 10, a chip 20, and a transparent layer 30, wherein a notched trench 11 is formed on a top surface of the base 10 for holding the chip 20 and the chip 20 is connected to an electrode (not shown) by a metal wire. The chip 20 is a blue light chip. The top of the notched trench 11 of the base 10 is covered with the transparent layer 30 such that the chip 20 is packaged in the trench 11. Thereupon the manufacture of the light-emitting diode is completed.

Figure 2:
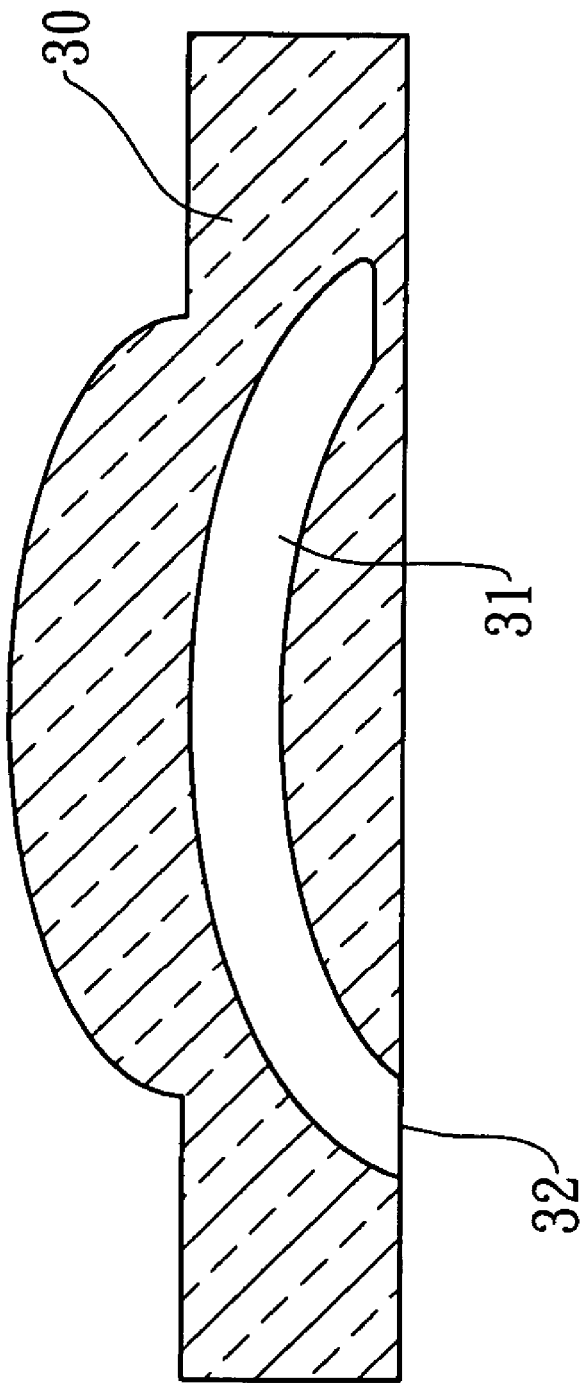
FIG. 2 is a cross-sectional view showing the dual-color optical lens in accordance with the present invention.
Figure 3:
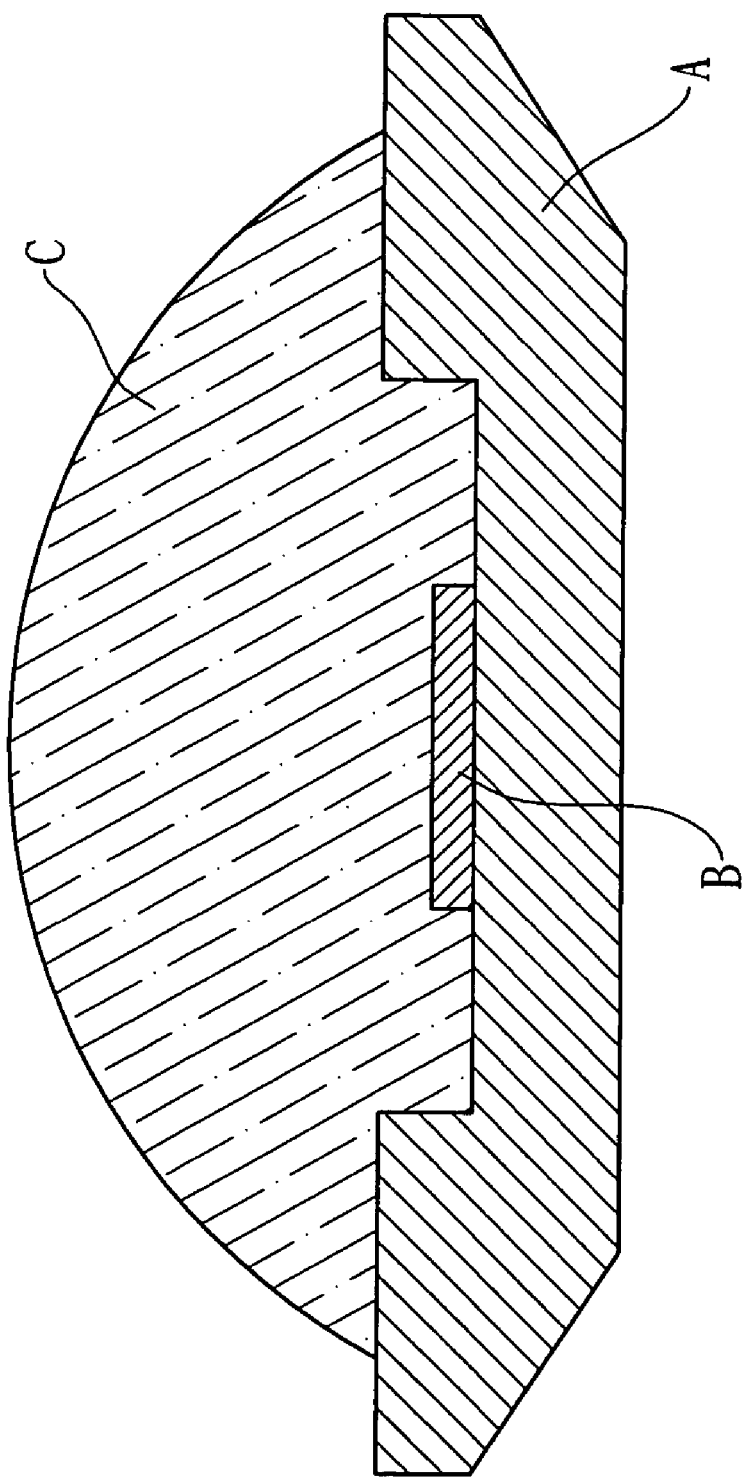
FIG. 3 is a cross-sectional view showing a conventional light-emitting diode.

The transparent layer 30 is principally made of an optical lens or Epoxy (simply referred to as "EP"). As shown in FIG. 2, an adhesive injection hole 32 is formed on the bottom of the transparent layer 30, and an open-end trench 31 is extended inwardly from adhesive injection hole 32 across the entire transparent layer 30. The adhesive is injected into the open-end trench 31 through the adhesive injection hole 32. Referring again to FIG. 1, the injected adhesive is fluorescent-powdered adhesive made of a mixture of yellow fluorescent powder and transparent insulating adhesive so as to form a fluorescent-powdered adhesive layer 33 in the open-end trench 31.

A working power is applied to the above manufactured light-emitting diode to allow the chip 20 to emit the blue light. The light, which is emitted from the chip 20, is delivered into the transparent layer 30 directly. Because the fluorescent-powdered adhesive layer 33 is formed across the entire transparent layer 30 to be mounted exactly above the chip 20, the blue light emitted from the chip 20 is changed into the white light by the fluorescent-powdered adhesive layer 33, which is made of a mixture of yellow fluorescent powder and transparent insulating adhesive.

Besides, the fluorescent-powdered adhesive layer 33 and the chip 20 are not limited to be the yellow fluorescence layer and the blue light chip, respectively. These two may have two mutually fitted colors so as to create the colorful light-emitting diode.

On the basis of the above-mentioned description, the structure of the present invention comprises the following practical advantages, in which:

1. The light color emitted from the light-emitting chip is changed such that the production cost, especially the white light diode, is reduced significantly.

2. The dual-color optical lens, which is composed of the transparent layer and the fluorescent-powdered adhesive layer, is provided with the advantages such as good light collection and uniform light shape.

3. The colors of the fluorescent-powdered adhesive layer and the chip can be arranged in pairs such that the light emitted from the light-emitting diode is colorful.

On the basis of the aforementioned description, it is apparent that the present invention can achieve the expected purposes. The present invention satisfies all requirements for a patent and is submitted for a patent.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments, which do not depart from the spirit and scope of the invention.

What the invention claimed is:

1. A high-brightness light-emitting diode having a chip, a base for holding the chip, and a transparent layer for covering the chip, the chip being connected to an electrode by a metal wire, characterized in that:

an adhesive injection hole is formed on the transparent layer and an open-end trench is extended inwardly from the adhesive injection hole so as to inject a layer of fluorescent-powdered adhesive into the open-end trench.

2. The high-brightness light-emitting diode of claim 1, wherein a notched trench is formed on the base for holding the chip.

3. The high-brightness light-emitting diode of claim 1, wherein the open-end trench is formed across the entire transparent layer such that when the transparent layer is coupled with the base the open-end trench is mounted exactly above the chip.

4. The high-brightness light-emitting diode of claim 1, wherein the fluorescent-powdered adhesive layer is made of a mixture of fluorescent powder and transparent insulating adhesive.

5. The high-brightness light-emitting diode of claim 1, wherein the index of refraction of the transparent layer is between 1.43 and 2.0.

6. The high-brightness light-emitting diode of claim 1, wherein the transparent layer is an optical lens.

* * * * *